United States Patent [19]

Crandall et al.

[11] 4,075,610
[45] Feb. 21, 1978

[54] METHOD OF STORING OPTICAL INFORMATION

[75] Inventors: Richard Seely Crandall; Brian Wilfred Faughnan, both of Princeton, N.J.

[73] Assignee: RCA Corporation, New York, N.Y.

[21] Appl. No.: 735,399

[22] Filed: Oct. 26, 1976

[51] Int. Cl.² ............................................. G11C 13/02
[52] U.S. Cl. ......................................... 365/107; 346/1;
346/160; 346/365; 365/112; 365/119
[58] Field of Search ................. 340/173 CH, 173 LS,
340/173 LT, 173 LM; 346/1, 74 CH, 74 P

[56] References Cited

U.S. PATENT DOCUMENTS 3,691,533  9/1972  Bogenberger ............... 340/173 CH
3,745,538  7/1973  Sharp ........................... 340/173 CH Primary Examiner—Terrell W. Fears
Attorney, Agent, or Firm—E. M. Whitacre; D. S. Cohen

[57] ABSTRACT

Optical information is stored in a member which includes a layer of electrochromic material and an electrolyte in contact with the electrochromic material. The electrolyte has particles of photoconductive material therein. The member is exposed to optical information such that electron-hole pairs are formed in the photoconductive material. The creation of the electron-hole pairs produces persistent coloration in the electrochromic material in an area which corresponds to the optical information. If desired, the stored information can be erased by applying an electric field to the member.

12 Claims, 1 Drawing Figure

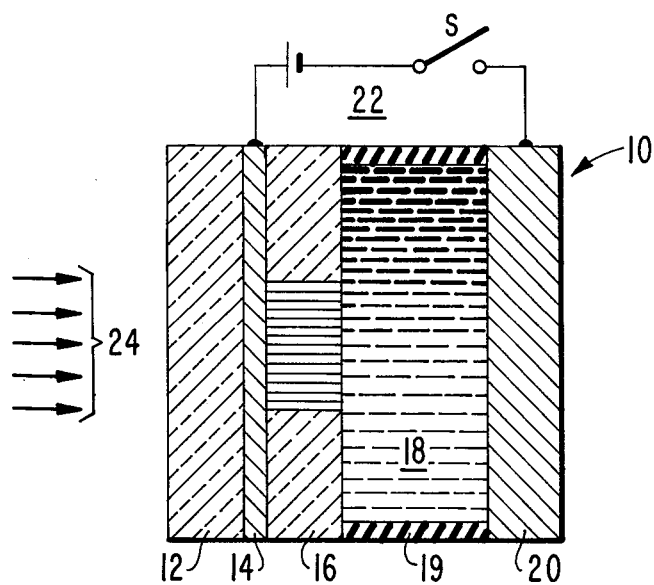

METHOD OF STORING OPTICAL INFORMATION

BACKGROUND OF THE INVENTION

This invention relates to a method of storing optical information, and particularly to such a method in which the optical information can be quickly stored without the use of any external electrical power and in which the stored optical information can be erased electrically.

Electrochromic devices are devices which exhibit a phenomenon known as "persistent electrochromism," e.g., see U.S. Pat. No. 3,521,941 entitled, "Electro-Optical Device Having Variable Optical Density," issued July 28, 1970. The term persistent electrochromism denotes the property of a material whereby its electromagnetic radiation absorpiton characteristic is altered under the influence of an electric field. By persistent it is meant the ability of the material to remain in the absorptive state after the removal of the electric field. Such materials, for example, may exhibit little or no absorption of visible wavelength in the absence of an electric field, and therefore be transparent, but when subjected to an electric field, effectively absorb in the red end of the spectrum, turning blue in color.

The phenomenon of persistent electrochromism has been exhibited in electrochromic devices which include an electrolyte-electrochromic sandwich wherein the electrolyte functions both as a conductive medium and as a source of positive ions. For example, see the sulfuric acid electrolyte of U.S. Pat. No. 3,708,220, issued Jan. 2, 1973. In these devices, the electrolyte is chosen to be sufficiently conductive so as to permit low voltage operation of the electrochromic device while also being chemically compatible with the electrochromic layer and electrode employed in the device.

Although the aforementioned U.S. Pat. No. 3,521,941 indicated that many of the electrochromic materials also exhibit the property of photochromism under ultraviolet light, it has been observed that methods of storing optical information which utilize the photochromic properties of electrochromic materials are time consuming, i.e., the materials are generally slow to color.

Another method of storing optical information which has been disclosed includes the use of a photoconductor layer in an electrochromic device such that the device becomes photoresponsive to the optical information to be stored. In this method, coloration speed, i.e., storage speed, is adequate. For example, coloration times of a few second are typical. Also, in this method, the photoconductor layer can be matched to the optical input. However, this method still requires the use of electrical energy, i.e., a biasing voltage in order for coloration to occur. The biasing voltage is required to be of a magnitude such that the electric field provided is insufficient to initiate the coloration process in the absence of the optical information. That is, in this method, the photoconductor layer functions as a switch.

Thus, it would be desirable to develop a method of storing optical information which is capable of fast coloration, i.e., fast storage, and in which the specific kind of optical information required for coloration can be chosen independently of the photochromic sensitivity of the electrochromic material. Also, it would be desirable to develop a method of storing optical information in which a biasing voltage is not required for storing the optical information.

SUMMARY OF THE INVENTION

A method of storing optical information includes providing a storage member having a layer of electrochromic material and an electrolyte in contact therewith. The electrolyte contains photoconductive material in particle form with at least some of the particles being in contact with the layer of electrochromic material. The photoconductive material is capable of creating electron-hole pairs when exposed to the optical information. The member is exposed to the optical information whereby the layer of electrochromic material colors in an area which corresponds to the optical information. The coloration occurs solely due to the exposure to the optical information.

BRIEF DESCRIPTION OF THE DRAWING

The FIGURE of the drawing is a cross-sectional view of one form of storage member useful in the method of the present invention.

DETAILED DESCRIPTION OF THE INVENTION

Referring to the drawing, one form of an optical storage member useful in the method of the present invention is generally designated as 10. The optical storage member 10 includes a transparent substrate 12, such as glass, having thereon a conductor layer 14, which may be transparent, such as tin doped indium oxide. The conductor layer 14 functions as a first electrode in the device 10. A layer 16 of electrochromic material, such as 5000A of tungsten oxide or molybdenum oxide, is on the conductor layer 14. An electrolyte 18, such as sulfuric or phosphoric acid, is on the layer 16 of electrochromic material. The electrolyte 18 is contained by an insulating spacer 19 which is of a material which in inert to the acid electrolyte 18, e.g., a plastic. A second electrode 20, of a conductive material such as aquadag, a conductive mixture of graphite and a nonconductive binder, is in contacting relation with the electrolyte 18. A conventional erasing network 22 is provided. The erasing network 22 includes a source of electrical potential, such as a battery, and a switch S.

The electrolyte 18 contains photoconductive material, e.g., titanium dioxide or silicon, in particle form. It is preferable that the particles of photoconductive material be extremely small sized, e.g., less than about 1 micron in diameter. The photoconductive material is capable of creating electron-hole pairs when exposed to optical information. Thus, it is desirable to employ a photoconductive material which exhibits a band gap which is less than or equal to the energy level of the optical information to be stored. This energy level relationship ensures the production of electron-hole pairs in the photoconductive material. Useful photoconductive materials include the following: ZnS, CdS, PbS; PbO; CdSe; CdTe; ZnSe; ZnTe; PbTe; PbSe; $CuO_2$; Ge; InSb; GaAs; and $Hg_xCd_{1-x}Te$. See also, R. Bube, Photoconductivity of Solids (John Wiley & Sons, Inc. 1960). The electrolyte 18 includes an effective amount of the photoconductive material, e.g., about 85 percent by volume, such that at least some of the particles of photoconductive material are in contact with the layer 16 of electrochromic material. Typically, an effective amount is an amount greater than about 80 percent by volume.

In the method of the present invention, the member 10 is exposed to optical information 24, e.g., visible light, as shown in the drawing, whereby the layer 16 of electrochromic material colors in an area which corresponds to the optical information 24. The coloration occurs solely due to the exposure to the optical information 24, i.e., no electrical power is necessary during the coloration process. For example, in the use of the member 10 of the drawing, the layer 16 of electrochromic material absorbs red in an area which corresponds to the optical information 24 so as to turn blue. Coloration time depends primarily on the intensity of the optical information 24, the relative matching of the photoconductive material to the energy of the optical information 24, and the contrast ratios desired. Depending on these parameters, coloration times of from about a few seconds to several minutes are typical. The coloration is persistent, i.e., storage times in excess of hours are typical. As previously mentioned, the coloration is stored without the need to provide or maintain an electric field. Although the stored optical information is persistent, it can be erased merely by providing the electrode 20 with a negative potential with respect to the conductor layer 14, i.e., closing the switch S in the drawing.

While not wholly understood, it is believed that the coloration process which occurs in the layer 16 of the electrochromic material is due to electrons from the electronhole pairs which are produced by the photoconductive particles, especially those particles which are adjacent to the layer 16 of electrochromic material. These electrons diffuse into the layer 16 of electrochromic material and then attract protons from the electrolyte 18 whereby coloration occurs in the area which corresponds to the optical input, i.e., the optical information 24. For further information on the coloration process, see R. S. Crandall and B. W. Faughnan, Applied Physics Letters, 26, 120 (1975). The stored information i.e., coloration, can be erased by subjecting the member 10 to an appropriate electric field since in order to erase the stored information in the member 10, it is necessary to remove the electrons and protons which were added to the layer 16 of electrochromic material during the coloration process.

The optical storage device 10 can be constructed through methods well known in the art. For example, beginning with a transparent substrate, e.g., glass, having a transparent conductor layer 14 thereon, a layer 16 of electrochromic material, such as tungsten oxide, can be deposited on the transparent conductor layer 14. Conventional deposition techniques such as evaporation or sputtering can be employed to deposit the tungsten oxide. An electrolyte 18, such as sulfuric acid or phosphoric acid, can be prepared and applied onto a portion of the layer 16 of electrochromic material. The acid electrolyte 18 may be in the range of from about 0.5 molarity (M) to about 5M, with about 2M being preferable. An effective amount of photoconductive material, i.e., greater than about 80 percent by volume, such as titanium dioxide or silicon, is mixed into the electrolyte 18. An electrode 29, such as aquadag on stainless steel can be prepared through any conventional means, e.g, see U.S. Pat. No. 3,827,784, entitled, "Simple, Bonded Graphite Counter Electrode for Electrochromic Devices", issued Aug. 6, 1974.

It should be noted that although the optical storage member has heretofore been described as having a first and second electrode, these electrodes are not essential. Optical storage will occur with or without these electrodes. However, these electrodes permit the stored optical information to be conveniently erased.

The method of the present invention allows one to employ a electrochromic material which need not be matched to the energy level of the optical information to be stored. Thus, the electrochromic material employed can be chosen for its display properties, e.g., color or persistence; it is only the photoconductive material which must be matched to the energy level of the optical information. Consequently, one skilled in the art need only choose one of the well known photoconductive materials rather than deal with the relatively unknown properties of electrochromic material. Furthermore, the optical information to be stored need not be confined to visible light; other forms of optical information can also be stored as long as the energy of the optical information is matched to the band gap of the photoconductive material. Thus, there is provided by the present invention a method of storing optical information which does not require the use of external electrical energy. It should also be noted that, if desired, the method of the present invention can also be used to detect the presence of optical information.

The invention can be further illustrated by the following examples, but it is to be understood that the invention is not meant to be limited to the details described therein.

EXAMPLE 1

The storage member included a tungsten oxide film having a thickness of $0.5\mu m$ (5000A). The film was disposed on a tin doped indium oxide electrode on a glass substrate. The electrolyte included between about 80 to about 90 percent by volume of titanium dioxide particles in a mixture of glycerol and 2M sulfuric acid. The particles of titanium dioxide were in the range of from about 0.1 to 1 micron in diameter. The counter electrode was aquadag on stainless steel.

The storage member was exposed to ultraviolet light from a Black-Ray B-100A lamp. Coloration of the film occurred in proportion to the exposure time under the lamp. After a 30 second exposure, the coloration in the film exhibited a visible contrast ratio of approximatly 3:1. An exposure time of 5 minutes resulted in a darkly colored film having a visible contrast ratio of approximately 25:1 . It should be noted that the actual contrast ratio in the darkly colored film is limited by the reflection from the glass substrate; it is not limited by the absorption properties of the electrochromic film. The darkly colored film had an optical density of 5 for a double pass therethrough.

The coloration stored during the 30 second exposure was removed by applying a bleaching voltage of 1.5 volts for a time period of approximately 1 or 2 seconds. The deeper coloration stored during the 5 minute exposure required a longer time period to be removed, i.e., approximately 10 to 15 seconds.

EXAMPLE 2

The storage member included a tungsten oxide film having a thickness of $0.5\mu m$ (5000A). The film was disposed on a tin doped indium oxide electrode on a glass substrate. The electrolyte included about 80 percent by volume of silicon powder in a mixture of glycerol and 2M sulfuric acid. The counter electrode was aquadag on stainless steel. The silicon powder was in the form of particles having an average diameter of about 30 microns.

The storage member was exposed to visible light from a tungsten microscope lamp. Coloration of the film occurred in proportion to the exposure time. The coloration rate was such that 10 minutes of exposure was required to reach a contrast ratio of 3:1. The coloration was removed by applying a bleaching voltage of 1.5 volts for a time period of approximately 1 to 2 seconds.

We claim:

1. A method of storing optical information, comprising the steps of:
providing a storage member having a layer of electrochromic material and an electrolyte in contact therewith, said electrolyte containing photoconductive material in particle form with at least some of said particles being in contact with said layer of electrochromic material, said photoconductive material being capable of creating electron-hole pairs when exposed to said optical information; and
exposing said member to said optical information whereby said layer of electrochromic material colors in an area which corresponds to said optical information, said coloration occurring solely due to said exposure to said optical information.

2. A method in accordance with claim 1 in which said photoconductive material has a band gap which is less than or equal to the energy of said optical information.

3. A method in accordance with claim 2 in which said particles of photoconductive material are less than about 1 micron in diameter.

4. A method in accordance with claim 2 in which said electrolyte comprises greater than 80% by volume of said photoconductive material.

5. A method in accordance with claim 2 in which said photoconductive material comprises silicon.

6. A method in accordance with claim 2 in which said photoconductive material comprises titanium dioxide.

7. A method in accordance with claim 2 in which said electrochromic material comprises tungsten oxide.

8. A method in accordance with claim 2 which includes the step of erasing said coloration which corresponds to said optical information.

9. A method in accordance with claim 8 in which said step of erasing includes subjecting said member to an electric field.

10. A method in accordance with claim 9 in which said member includes a first electrode in contact with said layer of electrochromic material and a second electrode in contact with said electrolyte, said first electrode being substantially transparent to said optical information.

11. A method in accordance with claim 10 in which said first electrode comprises tin doped indium oxide.

12. A method in accordance with claim 10 in which said second electrode comprises graphite disposed on a layer of stainless steel.

* * * * *